(12) United States Patent
Yamawaku et al.

(10) Patent No.: US 11,443,920 B2
(45) Date of Patent: Sep. 13, 2022

(54) PLASMA PROCESSING APPARATUS

(71) Applicant: TOKYO ELECTRON LIMITED, Tokyo (JP)

(72) Inventors: Jun Yamawaku, Yamanashi (JP); Tatsuo Matsudo, Yamanashi (JP); Chishio Koshimizu, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/730,861

(22) Filed: Dec. 30, 2019

(65) Prior Publication Data

US 2020/0144026 A1 May 7, 2020

Related U.S. Application Data

(63) Continuation of application No. 14/934,091, filed on Nov. 5, 2015, now abandoned.

(30) Foreign Application Priority Data

Nov. 5, 2014 (JP) .............................. JP2014-225230

(51) Int. Cl.
*H01J 37/32* (2006.01)

(52) U.S. Cl.
CPC ......... *H01J 37/3211* (2013.01); *H01J 37/321* (2013.01); *H01J 37/32165* (2013.01); *H01J 37/32183* (2013.01)

(58) Field of Classification Search
CPC ............. H01J 37/3211; H01J 37/32165; H01J 37/321; H01J 37/32183; H01L 21/02315;
(Continued)

(56) References Cited

U.S. PATENT DOCUMENTS

| | | | |
|---|---|---|---|
| 8,551,289 B2 | 10/2013 | Nishimura et al. | |
| 2001/0052394 A1* | 12/2001 | Jung ..................... | H01J 37/321 156/345.48 |

(Continued)

FOREIGN PATENT DOCUMENTS

| | | |
|---|---|---|
| JP | 2011-119659 A | 6/2011 |
| JP | 2012-209468 A | 10/2012 |

(Continued)

OTHER PUBLICATIONS

Tomsic, Joan L . . . (2000). Dictionary of Materials and Testing (2nd Edition)—reflected power. (pp. 335). SAE International. Retrieved from https://app.knovel.com/hotlink/pdf/id:kt00864XMD/dictionary-materials/reflected-power (Year: 2000).*

(Continued)

*Primary Examiner* — Ram N Kackar
*Assistant Examiner* — Laureen Chan
(74) *Attorney, Agent, or Firm* — Fenwick & West LLP

(57) ABSTRACT

A plasma processing apparatus includes a plasma generation unit for converting a processing gas into plasma by an inductive coupling. The plasma generation unit includes a first high frequency antenna formed of a vortex coil having open opposite ends and, at a central portion of a line between the open ends, a supply point of a high frequency power and a grounding point grounded through a capacitor; a second high frequency antenna formed of a planar vortex coil disposed between first and second high frequency antenna elements of the first high frequency antenna; and an impedance adjustment unit for adjusting a resonant frequency of a circuit viewed from a high frequency power supply toward the first high frequency antenna which is configured to have two resonant frequencies depending on adjustment of the impedance adjustment unit when the frequency of the high frequency power is changed.

7 Claims, 7 Drawing Sheets

(58) Field of Classification Search
CPC ............... H01L 21/0234; H01L 21/205; H01L 21/3065; H01L 21/683; H01L 2021/60187; H05H 1/46
See application file for complete search history.

(56) References Cited

U.S. PATENT DOCUMENTS

| | | | |
|---|---|---|---|
| 2002/0079058 A1 | 6/2002 | Okumura et al. | |
| 2003/0111962 A1* | 6/2003 | Shannon | H01J 37/321 315/111.41 |
| 2004/0027293 A1 | 2/2004 | Miyake et al. | |
| 2004/0124779 A1 | 7/2004 | Howald et al. | |
| 2007/0144672 A1* | 6/2007 | Kato | C23C 16/509 156/345.48 |
| 2010/0243162 A1* | 9/2010 | Koshimizu | H01J 37/321 156/345.28 |
| 2011/0094995 A1 | 4/2011 | Yamazawa et al. | |
| 2011/0094997 A1 | 4/2011 | Yamazawa et al. | |
| 2011/0104902 A1* | 5/2011 | Yamazawa | H05H 1/46 438/710 |
| 2012/0190207 A1* | 7/2012 | Nishimura | H01L 21/31138 438/710 |
| 2012/0247679 A1* | 10/2012 | Yamazawa | H01J 37/3244 156/345.48 |
| 2013/0267098 A1 | 10/2013 | Maeda et al. | |
| 2014/0216345 A1 | 4/2014 | Yamazawa et al. | |
| 2015/0097480 A1* | 4/2015 | Chung | H01F 38/14 315/34 |

FOREIGN PATENT DOCUMENTS

| | | |
|---|---|---|
| JP | 5227245 B2 | 7/2013 |
| KR | 2012-0086264 A | 8/2012 |
| KR | 2012-0112262 A | 10/2012 |
| WO | WO 2013/172665 A1 | 11/2013 |

OTHER PUBLICATIONS

Scanlan, J. O. (2020). Electrical impedance. AccessScience. Retrieved Jul. 27, 2021, from https://doi.org/10.1036/1097-8542.218500 (Year: 2020).*
Halkias, C. C. (2020). Impedance matching. AccessScience. Retrieved Jul. 27, 2021, from https://doi.org/10.1036/1097-8542.339100 (Year: 2020).*
United States Office Action, U.S. Appl. No. 14/934,091, dated Mar. 16, 2020, 24 pages.
United States Office Action, U.S. Appl. No. 14/934,091, dated Sep. 6, 2019, 31 pages.
United States Office Action, U.S. Appl. No. 14/934,091, dated Oct. 9, 2018, 23 pages.
United States Office Action, U.S. Appl. No. 14/934,091, dated Mar. 2, 2018, 20 pages.

* cited by examiner

C4:SMALL

C4:MIDDLE

PLASMA EXPANSION CONDITION

PLASMA PROCESSING APPARATUS

CROSS-REFERENCE TO RELATED APPLICATIONS

This application is a continuation application of U.S. patent application Ser. No. 14/934,091 filed on Nov. 5, 2015, which claims priority to Japanese Patent Application No. 2014-225230 filed on Nov. 5, 2014, which are incorporated herein by reference in their entirety.

FIELD OF THE INVENTION

The present invention relates to a plasma processing apparatus which performs a process on a substrate by exciting a processing gas.

BACKGROUND OF THE INVENTION

As one of the semiconductor manufacturing processes, there is a plasma process such as an etching process, a film forming process or the like which uses plasma of a processing gas. For example, in a single-substrate plasma processing apparatus, it is required to properly control the plasma density distribution to become appropriate in a plane direction of a substrate depending on a process type, specifically based on a structure in a processing chamber or in consideration of in-plane deviation of the substrate in a post-process. Therefore, the requirement is not limited to making the plasma density distribution uniform in an entire plane of the substrate and may include making the plasma density distribution different between a central portion and a periphery portion of the substrate.

As one of the plasma generating method in the plasma processing apparatus, there is a method in which, e.g., a high frequency power is supplied to an antenna and an induced electric field is generated in a processing chamber to excite a processing gas. For example, Japanese Patent Application Publication No. 5227245 (paragraphs [0055]-[0062], FIGS. 3 to 6) discloses a configuration in which a coil-shaped inner antenna and a coil-shaped outer antenna formed concentric to the inner antenna are provided as a high frequency antenna which outputs a high frequency, and each of the antennas resonates at a frequency of ½ wavelength of the high frequency. In this plasma processing apparatus, a circular electric field is each formed by each antenna, and thus in-plane distribution of the plasma density can be very delicately adjusted. However, a high frequency power supply needs to be provided at each of the inner antenna and the outer antenna.

Japanese Patent Application Publication No. 2011-119659 (paragraph [0045], FIGS. 1 and 2) discloses a plasma processing apparatus which includes a planar coil-shaped radio frequency (RF) antenna for generating a plasma, and a floating coil for performing an electromagnetic field correction with respect to a RF magnetic field generated from the RF antenna, the floating coil provided at a position where it can be combined with the RF antenna by electromagnetic induction. However, Japanese Patent Application Publication No. 2011-119659 does not disclose a technique for adjusting the distribution of high frequency power to monopole antennas connected in parallel to each other with respect to a common high frequency power supply.

SUMMARY OF THE INVENTION

In view of the above, the present invention provides a technique for adjusting in-plane distribution of plasma density in a plasma processing apparatus which performs a process on a substrate by generating plasma by using a high frequency antenna.

In accordance with an aspect, there is provided a plasma processing apparatus for performing a plasma process on a substrate in a processing chamber, the apparatus including: a mounting table on which the substrate is mounted, the mounting table being provided in the processing chamber; a processing gas supply unit configured to supply a processing gas into the processing chamber; an exhaust unit configured to vacuum-exhaust an inside of the processing chamber; a plasma generation unit arranged opposite to the mounting table through a dielectric window, the plasma generation unit including a high frequency antenna for converting the processing gas supplied into the processing chamber into plasma by an inductive coupling; and a shield member that surrounds a space where the high frequency antenna is arranged.

The plasma generation unit includes: a first high frequency antenna formed of a vortex coil having open ends at an inner side and an outer side, and including, at a central portion of a line between the open ends, a supply point of a high frequency power supplied from a high frequency power supply and a grounding point grounded through a capacitor, the first high frequency antenna having a resonant frequency corresponding to a frequency of the high frequency power, the first high frequency antenna further including a first high frequency antenna element formed of a portion of the vortex coil from one open end at the inner side or the outer side to the supply point of the high frequency power and a second high frequency antenna element formed of a portion of the vortex coil from the other open end to the grounding point; a second high frequency antenna formed of a planar vortex coil disposed between the first high frequency antenna element and the second high frequency antenna element when the first high frequency antenna is viewed from above; and an impedance adjustment unit including a variable capacitor connected to both ends of the second high frequency antenna and a capacitor connected to the second high frequency antenna element, the impedance adjustment unit being configured to adjust a resonant frequency of a circuit viewed from the high frequency power supply toward the first high frequency antenna.

The circuit viewed from the high frequency power supply toward the first high frequency antenna is configured to have a first resonant frequency and a second resonant frequency depending on adjustment of the impedance adjustment unit when the frequency of the high frequency power is changed.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with respect to the accompanying drawings.

Figure 1:
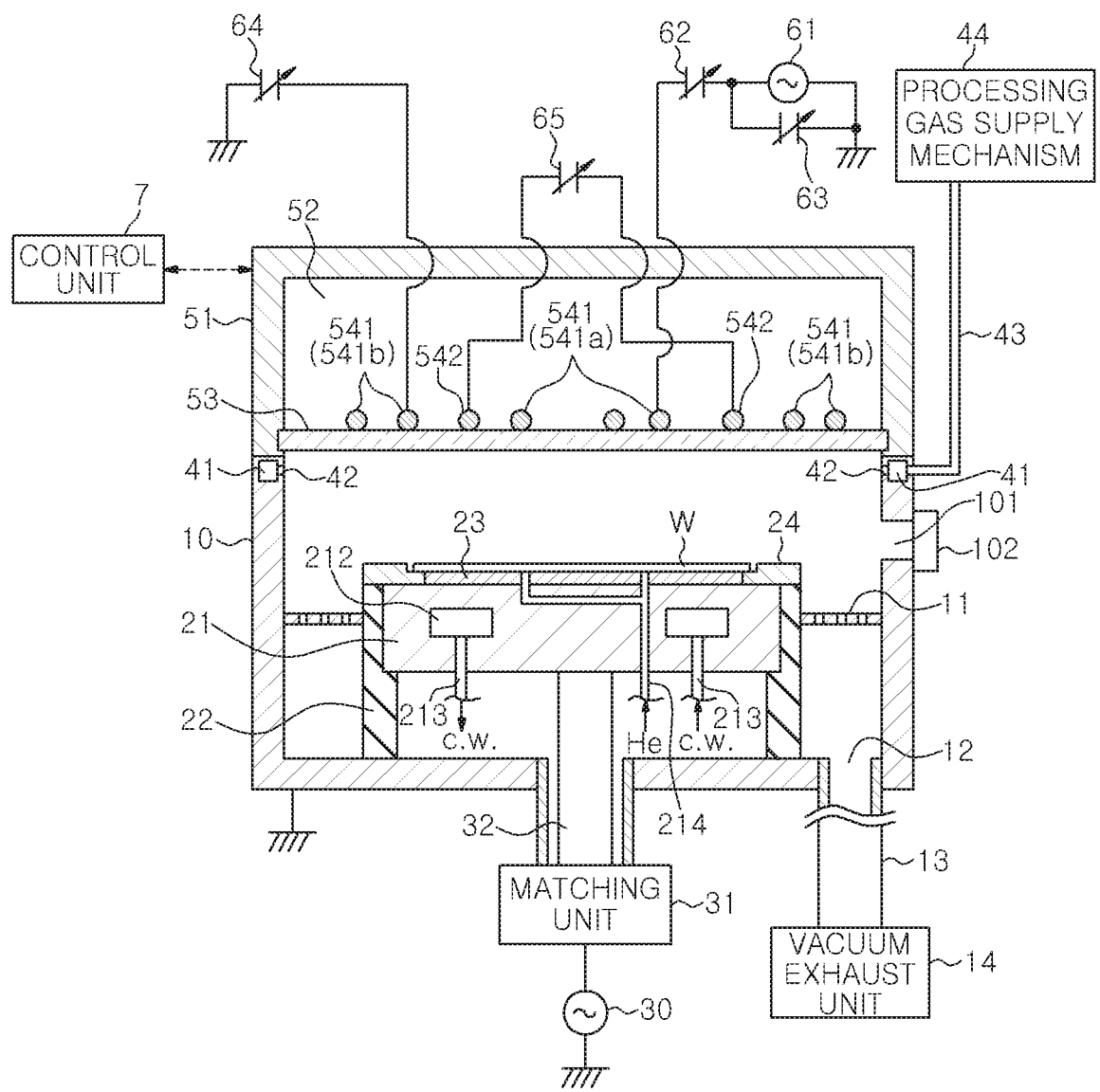
FIG. 1 is a vertical sectional side view of a plasma processing apparatus in accordance with an embodiment of the present invention.

A plasma processing apparatus in accordance with an embodiment of the present invention will be described. FIG. 1 shows an example in which a plasma processing apparatus of the present invention is applied to a plasma etching apparatus for performing an etching of a wafer W that is a substrate to be processed.

The plasma etching apparatus includes a grounded processing chamber 10 made of a conductive material such as aluminum, stainless steel or the like. A loading/unloading port 101 that is opened and closed by a gate valve 102 and through which the wafer W is loaded and unloaded is provided at a sidewall of the processing chamber 10.

At a central portion of the lower side in the processing chamber 10, there is provided a disk-shaped susceptor 21 serving as a mounting table on which a wafer W to be processed is mounted, and also serving as an electrode for attracting ions in plasma (an electrode for bias). The susceptor 21 is supported by a cylindrical susceptor support 22 made of an insulating material and the susceptor 21 is connected to a high frequency power supply 30 for bias through a power feed rod 32 and a matching unit 31. The high frequency power supply 30 supplies a high frequency power of, e.g., 13.56 MHz.

An electrostatic chuck 23 for holding the wafer W with an electrostatic attractive force is provided on the top of the susceptor 21. A focus ring 24 which surrounds the periphery of the wafer W is arranged at the outer side of the electrostatic chuck 23 in a diametric direction thereof.

A coolant path 212 through which a coolant, e.g., cooling water flows to control a temperature of the wafer W is provided in the susceptor 21. The coolant path 212 is connected to a chiller unit (not shown) through a line 213, and temperature-controlled cooling water is supplied from the chiller unit. A gas supply line 214 through which a heat transfer gas, e.g., He gas is supplied to between the electrostatic chuck 23 and the wafer W is provided in the susceptor 21. The gas supply line 214 penetrates through the electrostatic chuck 23 and a leading end of the gas supply line 214 is opened at the top surface of the electrostatic chuck 23.

In addition, elevating pins (not shown) for transferring and receiving the wafer W to and from an external transfer arm (not shown) is provided to vertically penetrate through the susceptor 21 and protrude beyond and retreat below the surface of the electrostatic chuck 23.

An annular baffle plate 11 formed of a perforated plate having a plurality of through-holes is provided between the susceptor support 22 and an inner wall surface of the processing chamber 10. At the bottom of the processing chamber 10, an exhaust port 12 is formed below the baffle plate 11. The exhaust port 12 is connected to a vacuum exhaust mechanism 14 through an exhaust line 13. The exhaust port 12, the exhaust line 13 and the vacuum exhaust mechanism 14 constitute an exhaust unit.

In the sidewall of the processing chamber 10, a processing gas supply passageway 41 is formed, above the loading/unloading port 101, along the circumferential direction of the sidewall. At an inner wall surface of the processing chamber 10 corresponding to a region where the processing gas supply passageway 41 is formed, a plurality of processing gas supply holes 42 is formed at intervals and communicates with the processing gas supply passageway 41. Connected to the processing gas supply passageway 41 is a processing gas supply mechanism 44 for supplying through a processing gas supply line 43 a processing gas that is an etching gas such as $CF_4$ gas, $C_4F_8$ gas, chlorine gas or the like. The processing gas supply passageway 41, the processing gas supply holes 42, the processing gas supply line 43 and the processing gas supply mechanism 44 constitute a processing gas supply unit of the present embodiment.

A dielectric window 53 formed of a dielectric such as quartz plate or the like is provided airtightly at a ceiling portion of the processing chamber 10. A space above the dielectric window 53 is covered with a shield box 51 that is a container made of a conductive material. A space surrounded by the dielectric window 53 and the shield box 51 becomes an antenna chamber 52 which accommodates antennas 541 and 542 for generating plasma. The shield box 51 arranged on the processing chamber 10 is grounded through the processing chamber 10.

Hereinafter, with reference to FIG. 2, description will be made on a configuration of a plasma generation unit including antennas 541 and 542 for converting a processing gas into plasma.

Figure 2:
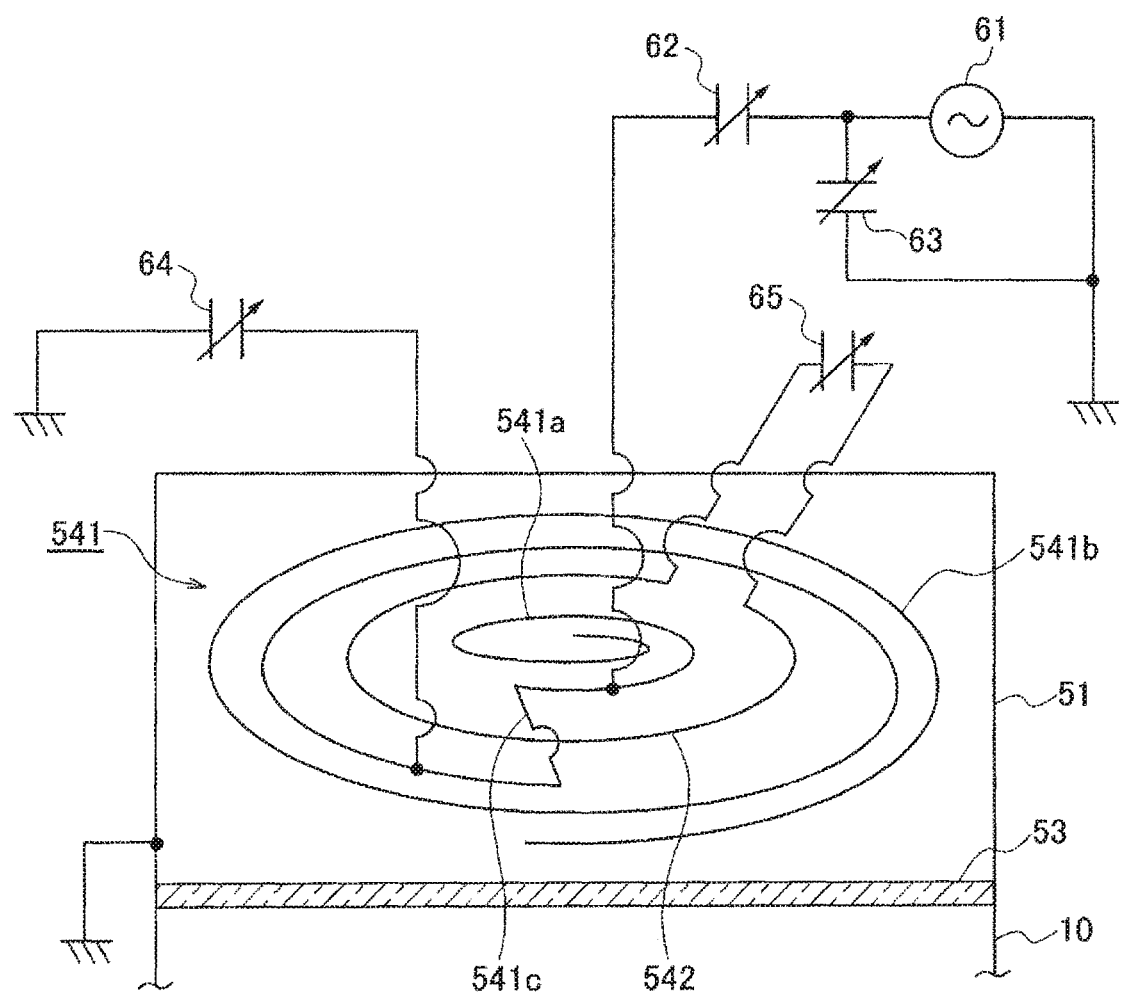
FIG. 2 is a schematic view of a plasma generation unit provided in the plasma processing apparatus.

A helical antenna 541 that is a first high frequency antenna is formed of a planar vortex coil in which a conducting wire is wound in the same plane in a vortex shape (in FIG. 2, in a counterclockwise direction when viewed from above).

Figure 3A:
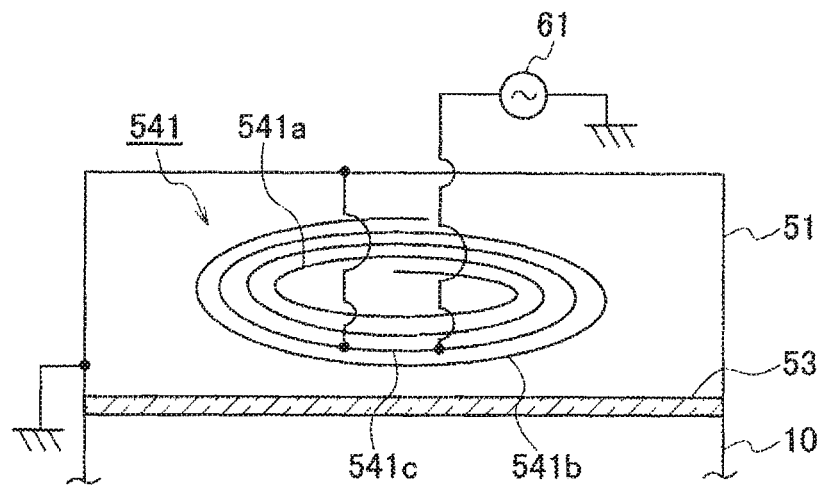
FIGS. 3A and 3B are explanatory views of a helical antenna having no absorbing coil.
Figure 3B:
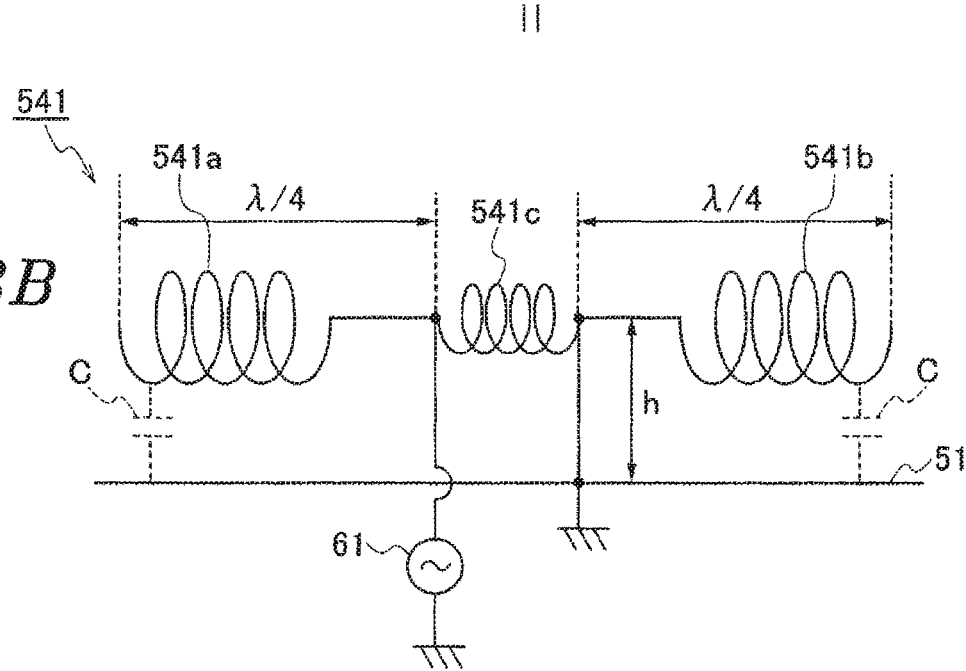

A configuration and operation of the helical antenna 541 will be briefly described with reference to FIGS. 3A and 3B. FIG. 3A shows a schematic view of the helical antenna 541 in which variable capacitors 62 to 64 for adjusting impedance, which will be described later, are omitted.

The helical antenna 541 has a configuration in which an inner antenna element 541a and an outer antenna element 541b are connected to each other. The inner antenna element 541a forms an inner part of the vortex coil, and the outer antenna element 541b is arranged outward of the inner antenna element 541a when viewed from above and forms an outer part of the vortex coil.

If an inner end of the inner antenna element 541a is referred to as one end portion, the one end portion is an open end and the other end portion connected to the outer antenna element 541b is connected to the high frequency power supply 61. Further, if an outer circumferential end of the outer antenna element 541b is referred to as one end portion, the one end portion is an open end and the other end portion connected to the inner antenna element 541a is grounded (through the shield box 51 in FIG. 3A).

The inner antenna element 541a and the outer antenna element 541b each have a line length of $((\lambda/4)+n \cdot (\lambda/2))$ (where n is a natural number including 0) with respect to a wavelength $\lambda$ of high frequency power having a frequency f applied from the high frequency power supply 61. In FIGS. 2 and 3A, a line length of the inner antenna element 541a and a line length of the outer antenna element 541b appear different from each other, but actually, they have the same line length satisfying the above-mentioned requirement.

The other end portion of the inner antenna element 541a and the other end portion of the outer antenna element 541b are connected to each other through a connection portion 541c that is a conducting wire forming a part of the vortex coil.

When the high frequency power of a wavelength λ is applied from the high frequency power supply 61 to the helical antenna 541 having the above-described configuration, a capacity coupling C is generated between the inner antenna element 541a and the shield box 51, and between the outer antenna element 541b and the shield box 51. As a result, there is formed a monopole antenna that has a resonant frequency near the wavelength λ (frequency f) of the high frequency power supplied from the high frequency power supply 61 and that is connected in parallel with respect to the high frequency power supply 61 (see FIG. 3B, which shows a case of (λ/4) at n=0).

Herein, actual line length of each of the antenna elements 541a and 541b may not be strictly equal to λ/4. In an antenna design, a line length of the monopole antenna is set to a value of an electromagnetic wavelength multiplied by a fractional shortening. In the present embodiment, the fractional shortening varies depending on how to wind the vortex coil and depending on the surrounding circumstances in which the antenna elements 541a and 541b are arranged. Accordingly, in the present embodiment, the expression "the antenna elements 541a and 541b each have a line length corresponding to λ/4" includes a case that the line length is set to about λ/4 in consideration of the effect of the fractional shortening and as a result, the antenna elements 541a and 541b each have a resonant frequency corresponding to the wavelength λ.

A distance h from the inner and outer antenna elements 541a and 541b to the shield box 51 that is a grounded plate (e.g., a distance to a ceiling plate of the shield box 51) becomes a variable for adjusting the fractional shortening of the inner and outer antenna elements 541a and 541b that are the monopole antenna. Therefore, by adjusting the distance h, resonant frequencies of the inner and outer antenna elements 541a and 541b can be changed.

Moreover, a line length of the connection portion 541c arranged between the high frequency power supply 61 and the grounding terminal becomes a variable for adjusting reflectivity. Therefore, the connection portion 541c functions as a matching circuit.

When a processing gas is supplied into the vacuum-exhausted processing chamber 10 and high frequency power is applied from the high frequency power supply 61 to the helical antenna 541 (the inner and outer antenna elements 541a and 541b), the high frequency power is efficiently supplied at a resonant frequency to the inner and outer antenna elements 541a and 541b. As a result, a high frequency magnetic field is formed in the processing chamber 10 through the dielectric window 53, and the processing gas is converted into plasma by a high frequency electric field induced by the formation of the magnetic field.

In the above-described perspective, the helical antenna 541 constitutes the first high frequency antenna of the present embodiment. Further, the inner antenna element 541a constitutes a first high frequency antenna element and the outer antenna element 541b constitutes a second high frequency antenna element.

According to the above-described configuration, plasma is formed in the processing chamber 10 by using the helical antenna 541 as a parallel-connected monopole antenna. Further, in the helical antenna, a distribution ratio of high frequency power to the inner and outer antenna elements 541a and 541b is fixed, so that it is not possible to control the plasma density distribution on the wafer W mounted on the susceptor 21.

Here, the present inventors have found that it is possible to change the distribution of high frequency power to the inner and outer antenna elements 541a and 541b by arranging an absorbing antenna (absorbing coil) 542 of an electrically-floated state between the inner antenna element 541a and the outer antenna element 541b that are a parallel-connected monopole antenna to adjust impedance.

Hereinafter, description will be made on a configuration of the plasma generation unit including the absorbing antenna 542 and a variable capacitor group for adjusting impedance with reference to FIG. 2.

As shown in FIG. 2, in the helical antenna 541 of the present example, the other end portion of the inner antenna element 541a connected to the high frequency power supply 61 and the other end portion of the outer antenna element 541b connected to a ground are arranged offset in a diametric direction of the vortex. As a result, the inner and the outer antenna elements 541a and 541b are arranged at separate positions in the diametric direction and thus a space for disposing the absorbing antenna 542 is formed therebetween. The other end portions of the inner and the outer antenna elements 541a and 541b are connected to each other by the connection portion 541c having a line extending in the diametric direction.

The high frequency power supply 61 has, e.g., a center frequency of 27 MHz and can change the frequency in a range of ±1 MHz depending on the impedance adjustment. A first variable capacitor 62 connected in series to the high frequency power supply 61 is provided between the high frequency power supply 61 and the inner antenna element 541a. A second variable capacitor 63 connected in parallel to the high frequency power supply 61 is provided between the grounding terminal of the high frequency power supply 61 and the first variable capacitor 62.

The other end of the outer antenna element 541b is grounded through a third variable capacitor 64, instead of the shield box 51 shown in FIG. 3A.

The first to third variable capacitors 62 to 64 (variable capacitor group) described above constitute an impedance adjustment unit of the present embodiment. In the present example, the first to third variable capacitors 62 to 64 constituting the impedance adjustment unit are mainly used as a matching circuit for adjusting reflectivity.

With respect to a wavelength λ of the center frequency of the high frequency power supply 61, each of the antenna elements 541a and 541b has a line length corresponding to λ/4. The numbers of turns of winding of the antenna elements 541a and 541b may be appropriately adjusted depending on the areas of arrangement regions of the antenna elements 541a and 541b and the like.

In summarizing the above description, the helical antenna 541 has open ends at the inner side and the outer side and is formed of a vortex coil having a resonant frequency corresponding to a frequency of the high frequency power supplied from the high frequency power supply 61. Moreover, a high frequency supply point from the high frequency power supply 61 and a ground point grounded through the third variable capacitor 64 are provided at a central portion of the line between two open ends.

When viewing the helical antenna 541 from above, the inner antenna element 541a from the open end at the inner side to the high frequency supply point corresponds to the first high frequency antenna element, and the outer antenna element 541b from the open end at the outer side to the ground point corresponds to the second high frequency antenna element.

The arrangements of the first and second high frequency antenna elements are not limited to the above example. For example, in FIG. 2, it may be possible to switch the high frequency supply point and the ground point. Then, the outer antenna element 541b from the open end at the outer side to the high frequency supply point corresponds to the first high frequency antenna element, and the inner antenna element 541a from the open end at the inner side to the ground point corresponds to the second high frequency antenna element.

Between the inner antenna element 541a and the outer antenna element 541b arranged at separate positions in the diametric direction, there is provided the absorbing antenna 542 that is a second high frequency antenna for controlling distribution of the high frequency power to the inner and outer antenna elements 541a and 541b. The absorbing antenna 542 is formed of an annular coil which is formed of a conducting wire wound in a round ring shape in the same plane.

Distances from the center of the annular coil to one end and the other end of the annular coil forming the absorbing antenna 542 are almost the same to each other.

A coil usable as the absorbing antenna 542 in the present embodiment is not limited to the annular coil having one turn of winding. There may be used a planar vortex coil formed of a conducting wire wound in a vortex shape (e.g., in a clockwise direction when viewed from above) of which the number of turns of winding is larger than one.

The "planar vortex coil" mentioned herein includes both of an annular coil having one turn of winding and a vortex coil having two or more turns of winding.

One end and the other end of the absorbing antenna 542 are both connected to a fourth variable capacitor 65. A circuit formed by the absorbing antenna 542 and the fourth variable capacitor 65 does not have a contact point with a circuit including the absorbing antenna 542 and the third variable capacitor 64, and is in an electrically-floated state. The fourth variable capacitor 65 forms a part of the impedance adjustment unit of the plasma generation unit. In this example, the fourth variable capacitor 65 forming the impedance adjustment unit is mainly used in adjustment of a resonant frequency.

In the plasma generation unit having the above configuration, it has been found that two different resonant frequencies appear when a frequency of the high frequency power supplied from the high frequency power supply 61 is changed by properly adjusting capacitances of the first to fourth variable capacitors 62 to 65 forming the impedance adjustment unit (refer to a test example to be described later). The positions at which the resonant frequencies appear can be controlled by setting each capacity of the impedance adjustment unit.

With respect to the resonant frequencies, in order to reduce loss of the high frequency power supplied to the inner and outer antenna elements 541a and 541b, it is preferable that a frequency difference between the resonant frequencies is made small. A distribution ratio of the high frequency power to the inner and outer antenna elements 541a and 541b can be controlled by, e.g., adjusting reflectivity in the connection portion 541c. The fourth variable capacitor 65 functions to adjust a level and direction of current flowing in the absorbing antenna 542. Levels of current flowing in the inner and outer antenna elements 541a and 541b are slightly different from each other. Therefore, the plasma density distribution formed by the inner and outer antenna elements 541a and 541b can be changed by interaction with the current flowing in the absorbing antenna 542.

When using the absorbing antenna 542 described above, it is possible to control the plasma density distribution formed in the processing chamber 10 by changing the high frequency power distributed to the absorbing antenna 542, and the inner antenna element 541a and the outer antenna element 541b included in the helical antenna 541 connected to the common high frequency power supply 61.

The detailed principle on the distribution of the high frequency power supplied from the high frequency power supply 61 to the inner antenna element 541a, the outer antenna element 541b, and the absorbing antenna 542 is not obvious. However, it seems to be a result of capacitive coupling formed between the inner antenna element 541a and the absorbing antenna 542, and between the outer antenna element 541b and the absorbing antenna 542.

As will be described in a test result, it is not possible to specify that which one of two resonant frequencies corresponds to which one of two antenna elements 541a and 541b.

For example, when high frequency power having a frequency of 27±1 MHz is supplied from the high frequency power supply 61, it becomes possible to control the positions at which two resonant frequencies appear by adjusting each capacity of the first to fourth variable capacitors 62 to 65 (impedance adjustment unit). As an adjustment method of the variable capacitors 62 to 65, there is a method of, e.g., controlling reflections at the first to third variable capacitors 62 to 64 while changing a resonant frequency by changing a capacity of the fourth variable capacitor 64 provided at the side of the absorbing antenna 542.

The configuration of the impedance adjustment unit is not limited to the above example as long as the positions at which the two resonant frequencies appear can be adjusted. For example, since a capacity between the helical antenna 541 (the inner antenna element 541a and the outer antenna element 541b) and the shield box 51 is changed by changing a distance therebetween, the two resonant frequencies may be adjusted by changing the distance. In this case, the distance may be changed by providing a height adjustment mechanism for the helical antenna 541 including an elevating mechanism. Alternatively, a plate, which has an elevating mechanism and is electrically connected to the shield box 51, may be installed and a distance between the plate and the helical antenna 541 may be changed.

Returning to the description of the plasma etching apparatus, as shown in FIG. 1, the plasma etching apparatus is connected to the control unit 7 which controls the entire operation. The control unit 7 includes a computer having a CPU (central processing unit) (not shown) and a storage unit (not shown). The storage unit stores programs including step (command) groups for the operation of the plasma etching apparatus, i.e., operations such as loading and unloading of the wafer W into the processing chamber 10, a vacuum exhaust, adjustment of a processing gas supply amount, supply of the high frequency power from the high frequency power supply 61, a capacity setting of the impedance adjustment unit, and the like. The programs are stored in a storage medium, e.g., hard disk, compact disk, magnet optical disk, memory card or the like and are installed in the computer therefrom.

The operation of the plasma etching apparatus having the above configuration will be described.

When a wafer W to be processed is loaded into the processing chamber 10 through the loading/unloading port 101 by, e.g., a transfer arm in a vacuum transfer chamber provided adjacent to the processing chamber 10, the elevating pins (not shown) are raised to receive the wafer W from the transfer arm. When the transfer arm is withdrawn from the processing chamber 10, the gate valve 102 is closed and the elevating pins are lowered to mount the wafer W on the electrostatic chuck 23.

When a direct current power is supplied to the electrostatic chuck 23, the wafer W is held on the electrostatic chuck 23. At this time, a temperature-controlled coolant flows through the coolant path 212, and a temperature of the wafer W is controlled through a heat transfer gas supplied from the gas supply line 214 to the backside of the wafer W. The inside of the processing chamber 10 is vacuum-exhausted through the exhaust port 12 by the vacuum exhaust mechanism 14.

If the inside of the processing chamber 10 becomes a predetermined pressure, a processing gas is supplied from the processing gas supply mechanism 44 into the processing chamber 10 while the vacuum-exhaust is continuously performed by the vacuum exhaust mechanism 14. Further, high frequency power is supplied from the high frequency power supply 61 to the helical antenna 541. Furthermore, high frequency power for bias is supplied from the high frequency power supply 30 to the susceptor 21.

When the high frequency power is supplied to the helical antenna 541, the power is distributed to the inner antenna element 541a and the outer antenna element 541b while being affected by the absorbing antenna 542. Further, an inductively coupled plasma (ICP) is formed under the inner antenna element 541a, the outer antenna element 541b, and the absorbing antenna 542 through the dielectric window 53.

At this time, a frequency of the high frequency power supplied from the high frequency power supply 61 to the helical antenna 541 and capacities of the first to fourth variable capacitors 62 to 65 are previously set by a processing recipe and the like. Accordingly, under the inner antenna element 541a, the outer antenna element 541b and the absorbing antenna 542, a desired plasma density distribution corresponding to the set values is formed, and further, density distribution of an active species such as ions of the processing gas and the like is formed corresponding to the plasma density distribution.

The active species thus obtained is attracted to the wafer W on the susceptor 21 by an act of the bias power and reaches the surface of the wafer W to perform an etching process. Since the density distribution of the active species is formed corresponding to the above plasma density distribution, the progress of the etching process can be controlled in the plane of the wafer W.

The plasma density distribution formed by the inner antenna element 541a, the outer antenna element 541b and the absorbing antenna 542 is not limited to a case where the plasma density distribution is controlled to become non-uniform in the plane of the wafer W. For example, in a case where a plasma density of the ICP formed by the inner and outer antenna elements 541a and 541b that are a parallel-connected monopole antenna is non-uniform between the central side and peripheral side of the wafer W, the distribution of the high frequency power may be controlled between the antenna elements 541a and 541b by using the absorbing antenna 542. BY doing so, the non-uniformity of the plasma density distribution, which will be caused in a case of only using the inner and outer antenna elements 541a and 541b, is resolved, so that a uniform process in the plane of the wafer W can be performed.

After the etching process of the wafer W is performed for a predetermined period of time, the supply of the processing gas through the processing gas supply hole 42 and the supply of high frequency power from the high frequency power supplies 61 and 30 are stopped. Next, a pressure in the processing chamber 10 is controlled. Thereafter, the gate valve 102 is opened and in the reverse order to the loading of the wafer W, the transfer arm receives the wafer W to unload the processed wafer W from the processing chamber 10.

With the plasma etching apparatus (plasma processing apparatus) in accordance with the present embodiment, the following effect is presented. The absorbing antenna (the second high frequency antenna) 542 is arranged between the inner and outer antenna elements 541a and 541b included in the helical antenna (the first high frequency antenna) 541, and the impedance adjustment unit is adjusted such that the antenna elements 541a and 541b have different resonant frequencies from each other. By doing so, distribution of high frequency power supplied to the high frequency antenna elements 541a and 541b can be changed. As a result, the plasma density distribution formed in the processing chamber 10 is changed and thus the progress of processing the wafer W can be adjusted in the plane of the wafer W.

Figure 4:
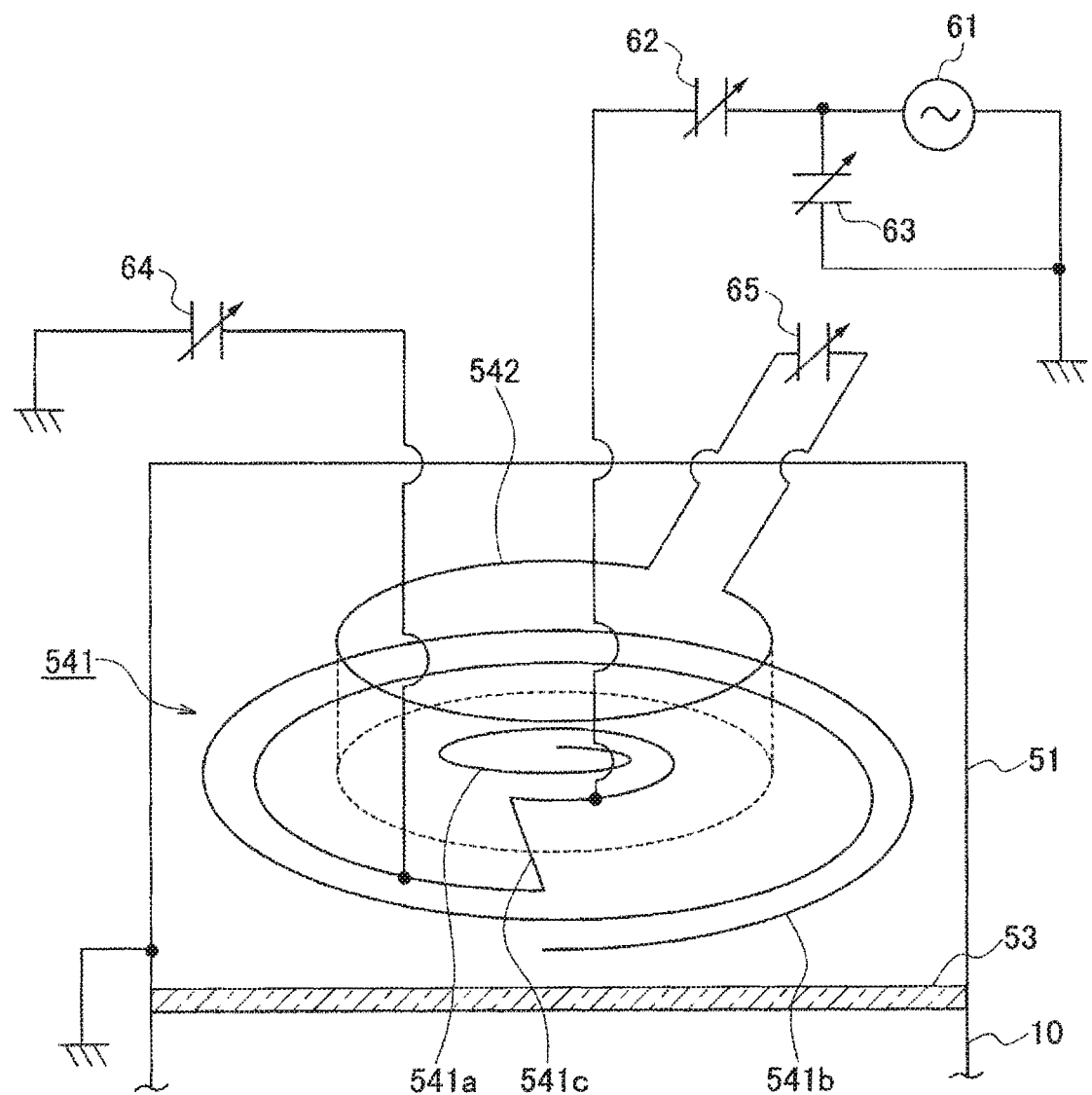
FIG. 4 is a schematic view showing a modified example of the plasma generation unit.

The arrangement of the helical antenna 541 and the absorbing antenna 542 is not limited to a case where they are positioned at the same height. For example, as shown in FIG. 4, the absorbing antenna 542 may be positioned above the helical antenna 541. Alternatively, contrary to the example shown in FIG. 4, the absorbing antenna 542 may be positioned under the helical antenna 541. As such, in a case where the helical antenna 541 and the absorbing antenna 542 are arranged in vertically different positions so as not to interfere with each other, it is not necessary to provide a space in which the absorbing antenna 542 is disposed. For example, when the helical antenna 541 is formed of a vortex coil in which the other end portions of the inner and outer antenna elements 541a and 541b are continuously connected to each other through the connection portion 541c without being separated in the diametric direction, the absorbing antenna 542 may be disposed above or under the helical antenna 541.

In a case where the absorbing antenna 542 is arranged under the helical antenna 541, it is not necessary to dispose the absorbing antenna 542 in the antenna chamber 52 surrounded by dielectric window 53 and the shield box 51. For example, the absorbing antenna 542 may be disposed in the processing chamber 10. In this case, the absorbing antenna 542 may be accommodated in a cover made of a conductor of the same material as the absorbing antenna 542, a dielectric such as quartz, alumina or the like, or a resin such as fluorine resin, aromatic polyetherketone resin (e.g., PEEK (polyetheretherketone)) or the like. Here, in order to suppress the generation of abnormal discharge at a high potential, the inside of the cover is preferably filled with a dielectric or a resin. In this example, the metallic processing chamber 10 accommodating the helical antenna 541 also serves as a shield box.

In the embodiment described with reference to FIGS. 1 to 3, the helical antenna 541 and the absorbing antenna 542 are formed of a planar vortex coil. However, the vortex coil forming the antennas 541 and 542 is not limited to the plane shape.

As another example, the inner antenna element 541a formed of a vortex coil having a helix shape extending in an axial direction is provided, and the outer antenna element 541b having the same helix shape is arranged in a double pipe shape so as to surround the periphery of the inner antenna element 541a. A high frequency supply point provided at the side of the inner antenna element 541a and a grounding point provided at the side of the outer antenna element 541b are connected to each other with the connection portion 541c therebetween. This forms the helical antenna 541.

The absorbing antenna 542 formed of a vortex coil of a helix shape is inserted into a space between the inner and outer antenna elements 541a and 541b arranged in a double pipe shape. In the absorbing antenna 542, the fourth variable capacitor 65 is provided at a position that connects one end and the other end of the helix extending in an axial direction.

In the embodiment with reference to FIG. 1, the plasma generation unit of the present invention has been applied to the plasma etching apparatus. However, the plasma processing apparatus to which the plasma generation unit can be applied is not limited to the plasma etching apparatus. For example, the plasma generation unit of the present invention can be applied to a plasma asking apparatus which removes a resist film formed on a wafer W by activating a processing gas such as oxygen gas or the like by using plasma, a plasma film forming apparatus which forms a film by CVD (chemical vapor deposition) or ALD (atomic layer deposition) by reacting a film forming gas (processing gas) activated by plasma on the surface of a wafer W, and the like.

Figure 5:
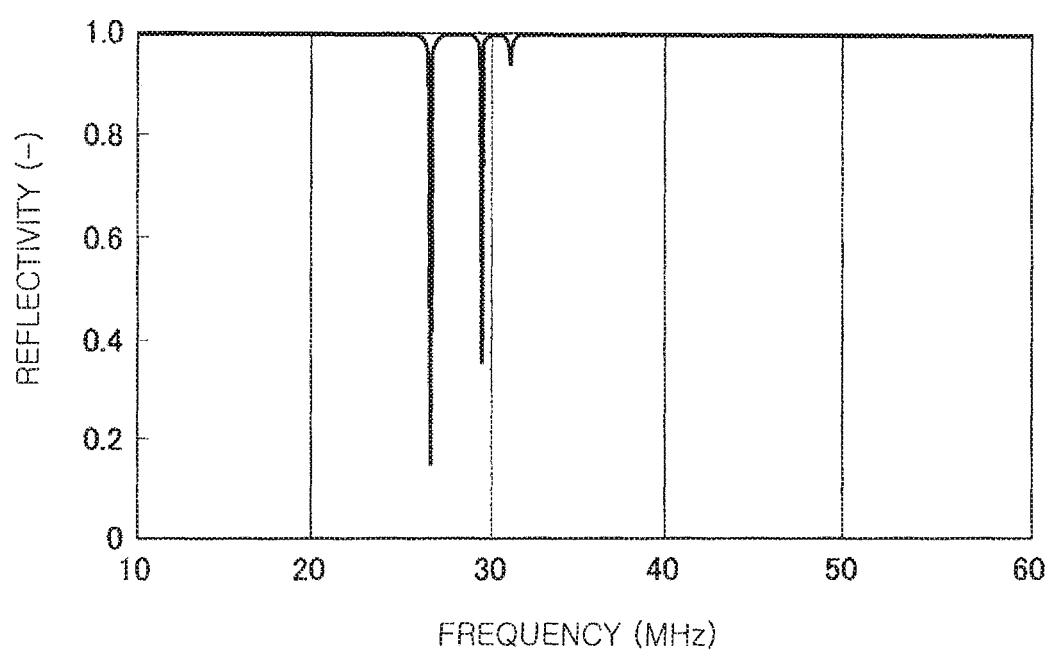
FIG. 5 is a frequency characteristic graph of the plasma generation unit.

Test Example (Test 1)
A resonant frequency was examined by changing a frequency of high frequency power supplied from the high frequency power supply 61 by using the plasma generation unit described with reference to FIGS. 1 and 2.
A. Test Condition
There was used the helical antenna 541 including the inner and outer antenna elements 541a and 541b that have two turns of winding and a line length at which a resonant frequency becomes 27 MHz. The helical antenna 541 and the absorbing antenna 542 were arranged at the same height position in the shield box 51. Under the condition that the capacities of the first to fourth variable capacitors 62 to 65 were fixed to a predetermined value, a reflectivity of a circuit viewed from the high frequency power supply 61 were measured while changing a frequency of the high frequency power supplied from the high frequency power supply 61 in a range of 10 to 60 MHz.
B. Test Result
The test result is shown in FIG. 5. In a graph of FIG. 5, the horizontal axis indicates a frequency of the high frequency power and the vertical axis indicates a reflectivity of the high frequency power viewed from the high frequency power supply 61. According to FIG. 5, frequencies at which reflectivity is sharply reduced were observed at two portions near 27 MHz that is the resonant frequency of the inner and outer antenna elements 541a and 541b. The observed frequencies are resonant frequencies of a circuit including the inner and outer antenna elements 541a and 541b. The positions at which the resonant frequencies are generated vary depending on capacities of variable capacitors 62 to 65. It is difficult to specify which resonant frequency corresponds to which one of the two high frequency antenna elements 541a and 541b. A small reduction of reflectivity presented in a higher frequency region than 30 MHz is considered caused by an effect of resonance between fixed parameters in a peripheral circuit and is negligible in view of ICP formation using the helical antenna 541 and the absorbing antenna 542.

Figure 6:
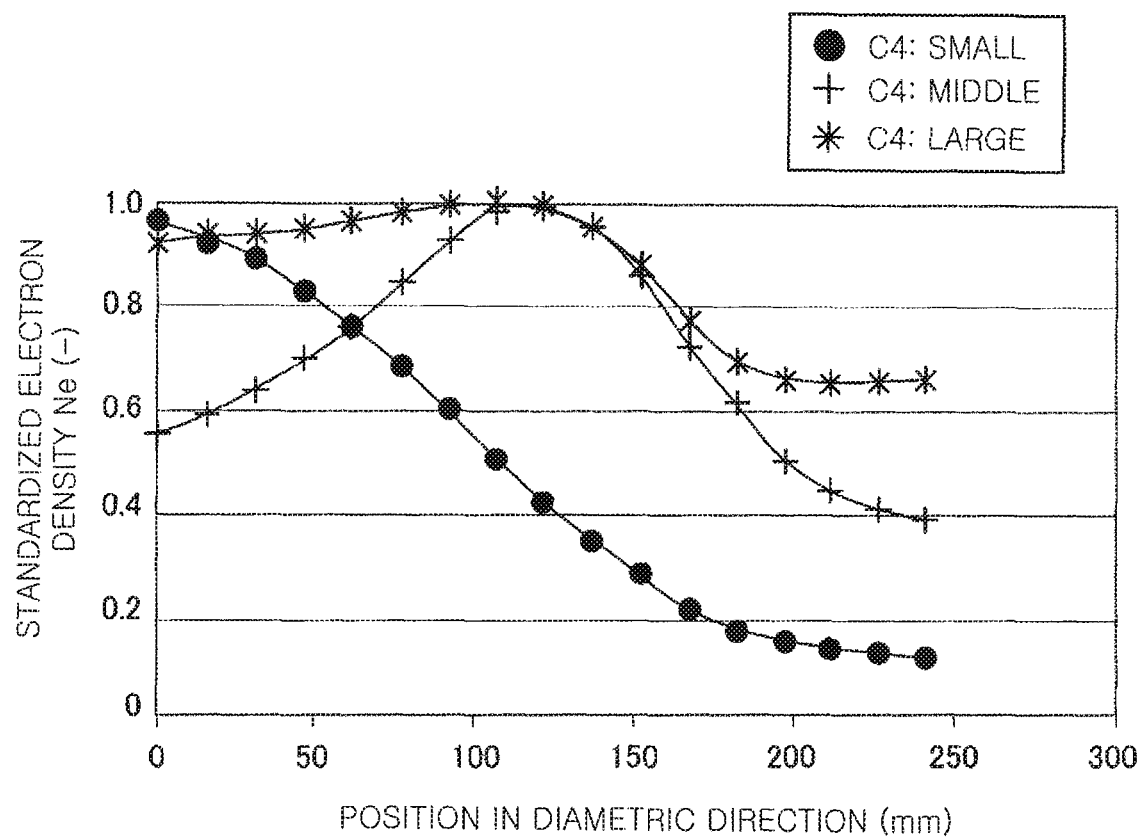
FIG. 6 is an explanatory view showing a density distribution of plasma generated by the plasma generation unit.
Figure 7A:
FIGS. 7A to 7C are explanatory views showing states of plasma generated by the plasma generation unit.
Figure 7B:
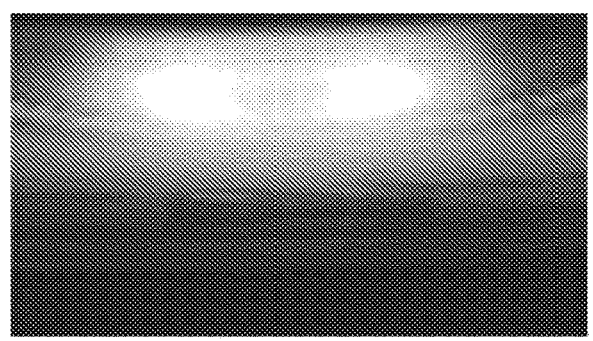
Figure 7C:
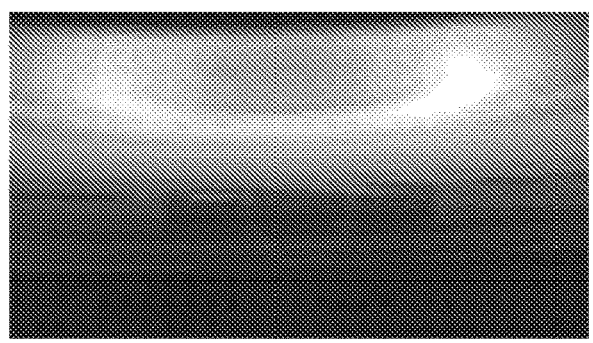

(Test 2)
A state of the ICP formed by the inner and outer antenna elements 541a and 541b and the absorbing antenna 542 was observed while changing the capacity of the fourth variable capacitor 65 by using the plasma generation unit that is the same as that used in the test 1.
A. Test Condition
A state of plasma was measured while controlling capacities of the first to third variable capacitors 62 to so as to reduce the reflectivity viewed from the high frequency power supply 61 and while gradually increasing capacity of the fourth variable capacitor 65 provided at the absorbing antenna 542. At that time, a frequency of the high frequency power supplied from the high frequency power supply 61 was changed in a range of about 27±1 MHz. The state of plasma was observed by the measurement of plasma density distribution and photography (visual observation).
B. Test Result
FIG. 6 shows plasma density distribution viewed in a diametric direction of the wafer W. In FIG. 6, the horizontal axis indicates a distance in the diametric direction from a position corresponding to the center of the wafer W, and the vertical axis indicates a value of an electron density Ne standardized by a maximum value NeMax of the electron density. In FIG. 6, a black circle plot indicates a state of the smallest capacity of the fourth variable capacitor 65, an asterisk plot indicates a state of the largest capacity of the fourth variable capacitor 65, and a cross plot indicates an intermediate state of the two previous conditions of the fourth variable capacitor 65. In photographs of FIGS. 7A to 7C, FIG. 7A represents when the capacity of the fourth variable capacitor 65 is the smallest, FIG. 7B represents when the capacity of the fourth variable capacitor 65 is intermediate. Further, FIG. 7C shows a result of examining an expanded state of plasma in accordance with the adjustment of the other variable capacitors 62 to 64. A test condition such as the capacity of the fourth variable capacitor 65 and the like is not the same between FIG. 6 and FIGS. 7A to 7C.

According to the result shown in FIG. 6, as the capacity of the fourth variable capacitor 65 is increased, a region having a high standardized electron density moves toward the periphery of the wafer W whereas the standardized electron density gradually becomes smaller in the central portion of the wafer W. This tendency is observed in a result of the photography. It is also found that as the capacity of the fourth variable capacitor 65 is increased, a plasma emitting region moves toward the periphery of the wafer W whereas plasma in the central portion of the wafer W is weakened (darkened).

As such, there is used the plasma generation unit including a circuit having two resonant frequencies by arranging the absorbing antenna 542 of an electrically-floated state between the inner and outer antenna elements 541a and 541b which form the monopole antenna connected in parallel to the high frequency power supply 61. Accordingly, even if only one high frequency power supply 61 is provided, it is possible to control the plasma density distribution.

While the invention has been shown and described with respect to the embodiments, it will be understood by those skilled in the art that various changes and modifications may be made without departing from the scope of the invention as defined in the following claims.

What is claimed is:

1. A plasma processing apparatus for performing a plasma process on a substrate in a processing chamber, the apparatus comprising:
   a mounting table on which the substrate is mounted, the mounting table being provided in the processing chamber;
   a plasma generation unit arranged opposite to the mounting table through a dielectric window, the plasma generation unit including a high frequency antenna for converting a processing gas supplied into the processing chamber into plasma by an inductive coupling;
   a shield member that surrounds a space where the high frequency antenna is arranged; and
   a high frequency power supply for supplying a high frequency power, the high frequency power supply being capable of changing a frequency of the high frequency power,
   wherein the plasma generation unit includes:
   the high frequency antenna formed of a vortex coil having open ends at an inner end and an outer end, and including, at a central portion of a line along the high frequency antenna between the open ends, a supply point of the high frequency power supplied from the high frequency power supply and a grounding point, wherein the high frequency antenna includes a first high frequency antenna element from one open end to the supply point, a second high frequency antenna element from the other open end to the grounding point, and a connection portion through which the first high frequency antenna element and the second high frequency antenna element are connected to each other;
   an annular coil arranged not to be connected to the high frequency antenna and not to be connected to the high frequency power supply; and
   an impedance adjustment unit configured to adjust impedance of the impedance adjustment unit when the frequency of the high frequency power is changed such that the first high frequency antenna element and the second high frequency antenna element have different resonant frequencies from each other,
   wherein a line length of the connection portion is adjusted to determine a distribution ratio of the high frequency power to the first high frequency antenna element and the second high frequency antenna element.

2. The plasma processing apparatus of claim 1, wherein the impedance adjustment unit includes a first variable capacitor connected between one end and the other end of the annular coil.

3. The plasma processing apparatus of claim 2, wherein a circuit viewed from the high frequency power supply toward the high frequency antenna is configured to have a first resonant frequency and a second resonant frequency depending on adjustment of the first variable capacitor when the frequency of the high frequency power is changed.

4. The plasma processing apparatus of claim 1, wherein each of the first high frequency antenna element and the second high frequency antenna element has a line length of $((\lambda/4)+(n\lambda/2))$ multiplied by a fractional shortening, where $\lambda$ is a wavelength of the frequency of the high frequency power and n is a natural number.

5. The plasma processing apparatus of claim 2, wherein the impedance adjustment unit further includes a second variable capacitor connected to the high frequency power supply, and
   wherein a circuit viewed from the high frequency power supply toward the high frequency antenna is configured to have a first resonant frequency and a second resonant frequency depending on adjustment of at least one of the first variable capacitor and the second variable capacitor when the frequency of the high frequency power is changed.

6. The plasma processing apparatus of claim 1, wherein the annular coil is arranged at a same height position as the high frequency antenna.

7. The plasma processing apparatus of claim 1, wherein the annular coil is arranged at a different height position from the high frequency antenna.

* * * * *